(12) United States Patent
Cottet et al.

(10) Patent No.: US 11,742,312 B2
(45) Date of Patent: Aug. 29, 2023

(54) HYBRID SHORT CIRCUIT FAILURE MODE PREFORM FOR POWER SEMICONDUCTOR DEVICES

(71) Applicant: Hitachi Energy Switzerland AG, Baden (CH)

(72) Inventors: Didier Cottet, Zurich (CH); Slavo Kicin, Zurich (CH)

(73) Assignee: Hitachi Energy Switzerland AG, Baden (CH)

( * ) Notice: Subject to any disclaimer, the term of this patent is extended or adjusted under 35 U.S.C. 154(b) by 271 days.

(21) Appl. No.: 17/311,562

(22) PCT Filed: Oct. 17, 2019

(86) PCT No.: PCT/EP2019/078249
§ 371 (c)(1),
(2) Date: Jun. 7, 2021

(87) PCT Pub. No.: WO2020/114660
PCT Pub. Date: Jun. 11, 2020

(65) Prior Publication Data
US 2022/0028822 A1 Jan. 27, 2022

(30) Foreign Application Priority Data
Dec. 7, 2018 (EP) ..................... 18211088

(51) Int. Cl.
*H01L 23/00* (2006.01)
(52) U.S. Cl.
CPC .......... *H01L 24/72* (2013.01); *H01L 2224/72* (2013.01); *H01L 2924/01013* (2013.01);
(Continued)
(58) Field of Classification Search
CPC ................................................... H01L 24/72
(Continued)

(56) References Cited

U.S. PATENT DOCUMENTS 11,056,408 B2 * 7/2021 Liu .................. H01L 23/492
2019/0355634 A1 * 11/2019 Liu .................. H01L 24/72

FOREIGN PATENT DOCUMENTS

EP 1475832 A1 11/2004
EP 2503595 A1 9/2012
(Continued)

*Primary Examiner* — Ajay Arora
(74) *Attorney, Agent, or Firm* — Slater Matsil, LLP (57) ABSTRACT

A power semiconductor module comprises a base plate (1); a semiconductor chip (2) disposed on and in contact with a top surface of the base plate (1), a preform (3) disposed on and in contact with a top surface of the semiconductor chip (2); and a pressing element (4) in contact with and applying a pressure onto a top surface of the preform (3). The preform (3) comprises a first electrically conductive layer (6) and a second electrically conductive layer (5). The first electrically conductive layer (6) has at least one protrusion (7) protruding towards the top surface of the semiconductor chip (2) and defining a recess (9) in the first electrically conductive layer (6) of the preform (3), wherein the recess (9) may annularly surround the protrusion (7). The at least one protrusion (7) is made from the same material as the first electrically conducting layer (6) and integrally formed with it or the first electrically conducting layer (6) and the at least one protrusion (7) are made from different materials. At least a portion of the second electrically conductive layer (5) is positioned in the recess (9) and on the top surface of the semiconductor chip (2). The material of the at least one protrusion (7) has a higher melting point than the material of the second electrically conductive layer (5). The power semiconductor module is configured so that in an event of semiconductor chip failure with heat dissipation, the protrusion (7) of the first electrically conductive layer (6) penetrates through residual material (8) of the semiconductor chip (2) upon pressure applied by the pressing element (4) towards the base plate (1) so as to establish a contact (Continued)

between the protrusion (7) of the first electrically conductive layer (6) and the base plate (1) and form a short circuit bridging the defective semiconductor chip (2) in a short circuit failure mode. The bottom surface of the preform (3) may be formed by a bottom surface of the second electrically conductive layer (5) alone or by a bottom surface of the second electrically conductive layer (5) and a bottom surface of the protrusion (7).

21 Claims, 3 Drawing Sheets

(52) U.S. Cl.
CPC ............... *H01L 2924/01042* (2013.01); *H01L 2924/1033* (2013.01); *H01L 2924/10272* (2013.01)

(58) Field of Classification Search
USPC .......................................................... 257/773
See application file for complete search history.

(56) References Cited

FOREIGN PATENT DOCUMENTS

| EP | 2554229 A1 | 2/2013 |
| EP | 2827366 A1 | 1/2015 |
| EP | 3306663 A1 | 4/2018 |
| EP | 3352213 A1 | 7/2018 |
| JP | S53020866 U | 2/1978 |
| JP | 2015095561 A | 5/2015 |
| WO | 2018141867 A1 | 8/2018 |

\* cited by examiner

HYBRID SHORT CIRCUIT FAILURE MODE PREFORM FOR POWER SEMICONDUCTOR DEVICES

CROSS-REFERENCE TO RELATED APPLICATIONS

This application is a national stage application of International Application No. PCT/EP2019/078249, filed on Oct. 17, 2019, which claims priority to European Patent Application No. 18211088.2, filed on Dec. 7, 2018, which applications are hereby incorporated herein by reference.

TECHNICAL FIELD

This invention relates to the field of power semiconductor modules.

BACKGROUND

In high power applications a series connection of multiple power semiconductor modules is usually required to fulfill high voltage requirements. Due to the series connection, failure of a single module may cause failure of the whole device. A power semiconductor module that in case of a failure of its semiconductor chip becomes permanently conductive may therefore have great advantages in such series connections. This capability is known as short circuit failure mode (SCFM).

In a failure event, heat is dissipated. In conventional semiconductor modules with a Si (silicon) based semiconductor element, a metal preform may be provided on the Si chip which is adapted to form a low melting eutectic alloy with the Si material of the chip and which creates a low ohmic path (short-circuit) to conduct the full current load through the failure point in case of a failure. For example, the eutectic reaction between Si (silicon) and Al (aluminum) at a relatively low temperature (577° C.) makes it possible to provide such an intrinsic failure compensation. A semiconductor module with a Si based semiconductor chip which is provided between two layers that are capable of forming an eutectic alloy with the Si material of the chip is presented in EP 2 503 595 A1.

In high power applications, semiconductor modules with wide-bandgap SiC (silicon carbide) based semiconductor elements are increasingly employed. However, the melting point of SiC (~2730° C.) is much higher than that of Si and it seems that there is no such low temperature eutectic reaction between SiC and common metals.

Without an intrinsic short-circuit failure mode (SCFM) capability, the complexity and the cost of systems may increase, and this may also hinder the application of advanced SiC semiconductor modules in high voltage and/or high power applications, such as high-voltage-direct-current (HVDC), Static Synchronous Compensator (STATCOM) etc., where series connections are usually needed.

Due to the high voltages and currents employed in high power applications, chip failure may cause the formation of a plasma with a high power density (failure arc plasma) inside the power module when the current is forced through the defective chip, which on the one hand may disintegrate/melt/evaporate the defective chip, but on the other hand may also destroy the entire semiconductor module and/or components of it. The risk that the entire semiconductor module becomes destroyed increases with the dissipated energy and thus the exposure to the failure arc plasma. It is therefore important that the short circuit is created fast and reliably when there is a failure event in order to limit the exposure time. Moreover, the short circuit should remain stable over a long time, such that the defective chip is reliably bridged, at least until the next planned servicing work, in the course of which the power module can be replaced.

An attempt to establish SCFM capability in power semiconductor modules uses molybdenum (Mo) based preforms. Therein, the preform is pressed against the semiconductor chip, such that the preform is moved towards the base plate when the SiC chip starts disintegrating in case of a failure event, wherein the disintegration rate is proportional to chip volume over arc energy (i.e. volume/energy), and the arc energy is proportional to the arc voltage and current and the time (i.e. $E \sim U*I*t$). A short circuit is created, when the preform touches the base plate.

Figure 1A:
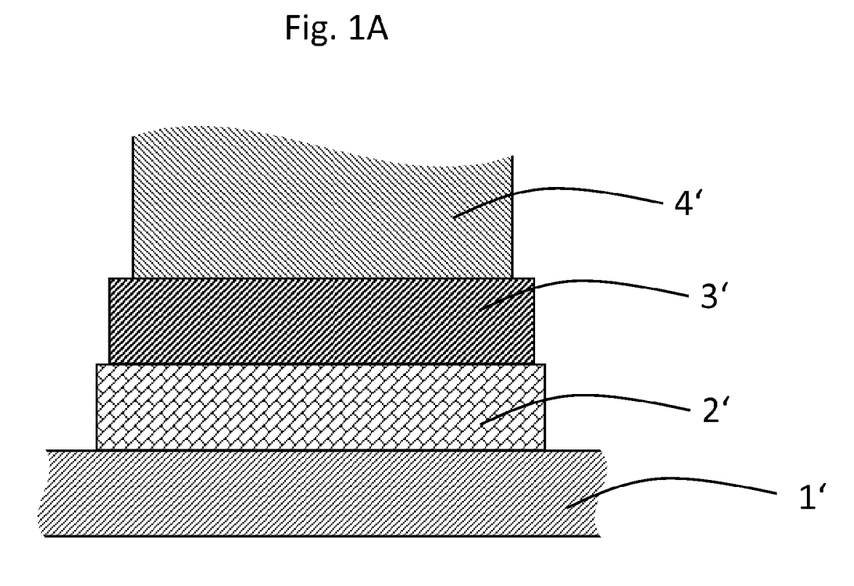
FIG. 1A schematically illustrates a power semiconductor module with short circuit failure mode capability and a large preform.
Figure 1B:
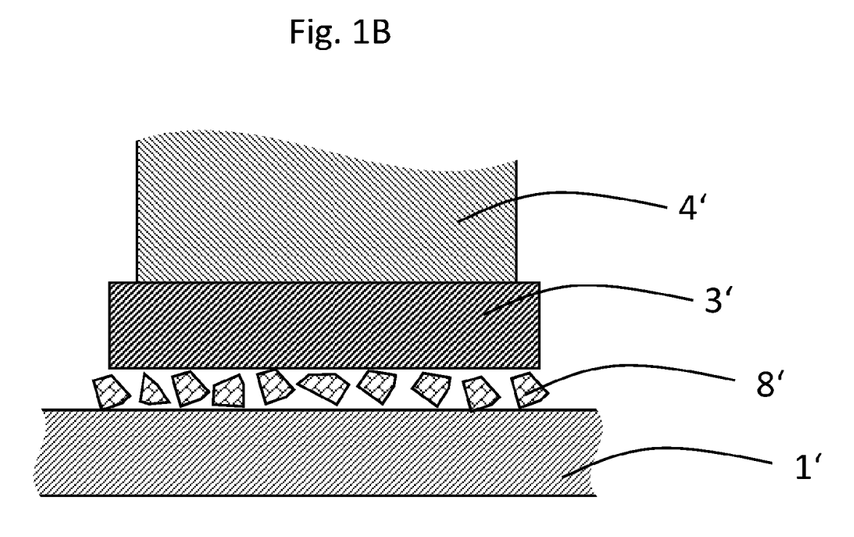
FIG. 1B schematically illustrates a limitations of a power semiconductor module with a large preform.

Since the energy required to disintegrate the SiC chip completely is proportional to the chip volume, this approach has the limitation, in particular for large area chips and large area preforms, which are required in high-power applications, that residual SiC material, e.g., debris, may remain and may prevent direct contact between the preform and the base plate and thus fast and reliable formation of a short circuit (see FIG. 1B). As a consequence the entire module may become destroyed due to a too long exposure to the failure arc plasma. Establishing contact between the preform and the base plate may be facilitated when the area of the Mo preform is significantly smaller than the area of the SiC chip. This has however negative effects on the performance of the semiconductor module in normal operation where for optimal performance it is required that the preform contacts the full active area of the SiC chip in order to achieve best electrical connection. Also there are reliability concerns with respect to mechanical stability because when the area of the preform is significantly smaller than the area of the SiC chip, then the mechanical pressure (pressure=load/area) is concentrated on a small area of the SiC chip, which increases the risk of destroying the SiC chip.

From EP 3 306 663 A1 it is known a semiconductor module that comprises a semiconductor chip having a SiC epitaxy layer on the Si base layer. The SiC epitaxy layer comprises a semiconductor element; an electrical conducting top layer consisting of molybdenum for providing an electrical contact of the semiconductor module on a side of the SiC epitaxy layer; an electrical conducting bottom layer consisting of molybdenum for providing an electrical contact of the semiconductor module on a side of the Si base layer; and a failure mode layer in contact with a top and/or bottom surface of the semiconductor chip and arranged between the top layer and the bottom layer. The failure mode layer comprises a metal material adapted for forming a eutectic alloy with the Si base layer to short-circuit the semiconductor module.

From WO 2018/141867 A1 it is known a power semiconductor module that comprises a base plate; a Si chip attached to the base plate; a first metal preform pressed with a first press pin against the Si chip; a wide bandgap material chip comprising a wide bandgap substrate and a semiconductor switch provided in the wide bandgap substrate; and a second metal preform pressed with a second press pin against the wide bandgap material chip. The Si chip and the wide bandgap material chip are connected in parallel via the base plate and via the first press pin and the second press pin; wherein the first metal preform is adapted for forming a conducting path through the Si chip, when heated by an overcurrent; and the second metal preform is adapted for forming an temporary conducting path through the wide bandgap material chip or an open circuit, when heated by an overcurrent.

From EP 1 475 832 A1 it is known a pressure contactable semiconductor power module that has one or more semiconductor chips, an electrically conducting base plate, and electrically conducting top plate and for each semiconductor chip, a first contact pin for providing an electrically conducting connection between the electrically conducting top plate and the semiconductor chip.

From EP 2 827 366 A1 it is known a spring element for a power semiconductor module having an upper contact area for directly or indirectly connecting the spring element to a load plate and having a lower contact area for directly or indirectly connecting the spring element to a power semiconductor device, wherein the spring element has a plurality of grooves located along the circumference and restricted with respect to the circumference, wherein the grooves provide a spring deflection of the spring element. Such a spring element provides for a stable and reliable failure mode and further has an improved and cost-saving producibility. The present invention further relates to a power semiconductor module comprising at least one spring element.

From EP 2 544 229 A1 it is known a power semiconductor arrangement comprising a power semiconductor device, having an emitter electrode and a collector electrode, wherein the collector electrode is electrically connected to a lower electrode and wherein the emitter electrode is electrically connected to an upper electrode, wherein the arrangement further comprises a failure mode contact element and a low temperature melting material, the low temperature melting material being arranged between the failure mode contact element and the semiconductor device, wherein the failure mode contact element is spring loaded towards the low temperature melting material and comprises at least one contact portion being spaced apart from the lower electrode in a distance being smaller or equal than the thickness of the low temperature melting material in a regular working mode of the power semiconductor arrangement.

SUMMARY

Embodiments of the invention provide a power semiconductor module based on a wide-bandgap semiconductor chip, having an improved short circuit failure mode (SCFM) and obviating at least one of the disadvantages known in the art.

BRIEF DESCRIPTION OF THE DRAWINGS

The subject matter of embodiments of the invention will be explained in detail in the following description with reference to exemplary embodiments which are illustrated in the attached drawings.

The reference signs used in the figures and their meanings are summarized in the list below. Generally, alike or alike-functioning parts are given the same reference signs. Reference signs with an apostrophe sign refer to an embodiment to be improved. The described embodiments are meant as examples and shall not limit the scope of the invention as defined by the appended claims. It has to be noted that the terms "top" and "bottom" used herein have to be understood relative to the base plate and that the semiconductor module also may be mounted with the top surface facing to the ground, for example. "Lateral" refers to a direction which is perpendicular to the top-bottom-direction.

1, 1' base plate
2, 2' semiconductor chip
3, 3' preform
4, 4' pressing element
5 second electrically conducting layer
6 first electrically conducting layer
7, 7' protrusion
8, 8' debris
9, 9' recess
10 edge

DETAILED DESCRIPTION OF ILLUSTRATIVE EMBODIMENTS

This invention relates to the field of power semiconductor modules. In one embodiment, the module comprises a base plate, a wide-bandgap semiconductor chip disposed on the base plate, a preform disposed on the wide-bandgap semiconductor chip, and a pressing element configured to apply a pressure onto the preform. Particular embodiments relate to a hybrid preform providing short-circuit failure mode (SCFM) capability in such power semiconductor modules.

Examples of the invention relate to a power semiconductor module. Here and in the following, the term "power" may relate to the ability to process currents of more than 1 A, for example more than 10 A, and/or voltages of more than 100 V, for example more than 500 V. A power semiconductor module may be any kind of arrangement of a semiconductor chip together with further members such as electrical conducting layers, electrical conducting elements and/or electrical isolating element in mechanical and/or electrical contact with the semiconductor chip.

A power semiconductor module according to an embodiment of the invention comprises a base plate, a semiconductor chip including a wide-bandgap semiconductor material, a preform and a pressing element. The semiconductor chip is disposed on a top surface of the electrically conductive base plate, a bottom surface of the semiconductor chip is in contact with the top surface of the base plate, the preform is disposed on a top surface of the semiconductor chip, a bottom surface of the preform is in contact with the top surface of the semiconductor chip, and the pressing element is in contact with the top surface of the preform and is configured to apply a pressure onto the top surface of the preform towards the base plate. Moreover, the preform is a hybrid preform which comprises a first electrically conductive layer and a second electrically conductive layer, wherein the first electrically conductive layer has at least one protrusion (to reduce the contact area of the preform and therefore to increase the pressure on the semiconductor chip in case of a failure), for example a single protrusion or a plurality of protrusions, which protrudes towards the top surface of the semiconductor chip and forms (defines) at least one recess, for example a single recess or a plurality of recesses, in the first electrically conductive layer of the preform; at least a portion of the second electrically conductive layer is disposed in the at least one recess and on the top surface of the semiconductor chip, for example the at least one protrusion may be laterally surrounded by the second electrically conductive layer; the at least one protrusion and the first electrically conductive layer are made from the same material or from different materials, and the material of the at least one protrusion has a higher melting point than the material of the second electrically conductive layer.

Since the second electrically conducting layer is disposed in the at least one recess and on the top surface of the semiconductor chip, a large contact surface between the semiconductor chip and the preform is provided. Since the pressing element applies a pressure onto the top surface of the preform towards the base plate, the preform is pressed towards the base plate and against the semiconductor chip. By these means, optimal electrical connection between the preform and the semiconductor chip may be achieved and thus optimal performance of the module in normal operation. In addition, having a large bottom surfaces minimizes the risk of mechanically damaging the semiconductor chip because the mechanical pressure applied by the pressing element on the preform is distributed over a large area of the semiconductor chip.

Moreover, when heat is dissipated during a failure event, e.g., through a failure arc plasma, the material of the second electrically conductive layer, because of its lower melting point, undergoes a phase change, e.g., disintegrates/melts/ evaporates, whereas the material of the first electrically conductive layer, because of its higher melting point, withstands the dissipated heat, i.e. it does not disintegrate/melt/ evaporate or only on a much longer timescale. In other words, the second electrically conductive layer is a sacrificial layer configured to decompose/disintegrate significantly faster during a failure event than the first electrically conductive layer. Thus, when there is a failure event and heat is dissipated, the second electrically conductive layer of the preform decomposes/disintegrates leaving only the part of the preform corresponding to the first electrically conductive layer and thus exposing the at least one protrusion. Since the at least one protrusion forms at least one recess in the first electrically conductive layer, the contact area between the preform and residual semiconductor material, e.g., debris and particles of a not completely disintegrated semiconductor material, becomes smaller. Thus, when being pressed by the pressing element towards the base plate, the preform and more exactly the at least one protrusion of the preform, penetrates more easily through residual material of the semiconductor chip and the risk of such residual material (e.g., debris) preventing contact between the preform and the base plate is reduced. By this means, the power module according to the embodiment of the invention provides a faster and more reliable formation of a short circuit bridging the defective semiconductor chip and thus an improved SCFM capability. Thus, the hybrid preform according to the embodiment of the invention provides both, a large bottom surface for optimal electrical connection with the semiconductor chip during normal operation and when there is a semiconductor failure and heat is dissipated, a small bottom surface, i.e. the bottom surface of the at least one protrusion, for a fast and reliable short circuit formation. The short circuit contact after a failure does not have to have the same large surface as the semiconductor chip. The length of the at least one protrusion should be such that it can penetrate through the debris. In other words, the depth of the at least one recess should be deep enough be able to accommodate debris particles. Thus the dimension of the at least one protrusion/recess should be adapted to the size of the expected debris. Typically it is sufficient when the length of the protrusion (i.e. the depth of the recess) corresponds to the thickness of the semiconductor chip. Shorter protrusions/ recesses may however also be possible. Since the preform according to the embodiment of the invention is essential for enabling the SCFM capability, it may also be called failure mode layer.

According to at least one exemplary embodiment of the invention, the preform has a plate-like body with two planar surfaces. The semiconductor chip and the base plate may also have a substantially plate-like body. The semiconductor chip may have flat electrodes provided on both sides. The preform, the semiconductor chip and other layers of the semiconductor module may for example be shaped as a disc or a cuboid, wherein in one direction, the thickness is much thinner than in the other directions.

The pressure device may be in laminar contact with the top surface of the preform. The bottom surface of the preform may be in laminar contact with the top surface of the semiconductor chip; and the bottom surface of the semiconductor chip may be in laminar contact with the top surface of the base plate.

It has to be noted that electrode/metallization layers for electrically connecting the semiconductor chip are considered as being part of the semiconductor chip. Thus a top/bottom surface of a semiconductor chip may refer to both a surface of an electrode/metallization layer of the semiconductor chip and a surface of a semiconductor material included in the semiconductor chip.

The base plate may be used for mechanically supporting the semiconductor chip. The base plate may be completely electrically conducting or at least comprises an electrically conducting layer. The base plate may be used as an electrical contact of the power semiconductor device. The base plate may for example comprise one of Cu, Mo, Al-graphite (aluminium graphite composite), AlSiC (Aluminium silicon carbide composite), AlSip (aluminium matrix composite reinforced with high amount of silicon particles), copper-molybdenum alloy and the like. These materials may have thermal expansion coefficients adapted to the one of the semiconductor chip. Exemplarily, the semiconductor chip may be bonded to the base plate but may also be only pressed against the base plate. The preform may be bonded to the semiconductor chip but is exemplarily only pressed against the semiconductor chip. The pressing element may be bonded to the preform but exemplarily only presses the preform.

Herein and in the following bonding refers to any suitable process in which two members are connected with each other, for example by welding, ultrasound welding, sintering, soldering or the like.

The pressing element presses the preform, the semiconductor chip and the base plate together. The pressing element may be a suitably shaped body, e.g., a cylinder, a cuboid and the like, pressed against the top surface of the preform with an elastic element, a clamping device, a screwing device and the like. The pressing element may also be a spring or a spring element, for example comprise one or more disc springs. The pressing element may be electrically conducting. The pressing element may be made of metal, for example copper, brass and the like. The pressing element may be made of a different material than the preform. The pressing element may serve as an electrical contact of the power semiconductor module. For example, the pressure applied be the pressure element on the preform may be in a range between 0.1 Pa to 10 Pa. Depending on the ratio of the protrusion bottom area to the preform top area, the pressure on the semiconductor chip therefore can be multiplied by the factor of (protrusion bottom area/the preform top).

The wide-bandgap semiconductor material included in the semiconductor chip may for example be characterized of having a bandgap of at least 2 eV. The wide-bandgap semiconductor material included in the semiconductor chip may for example comprises silicon carbide (SiC) and/or Gallium nitride (GaN). The semiconductor material may be doped. The semiconductor chip may for example be a semiconductor switch with a gate that is adapted for controlling a resistance between two further electrodes of the semiconductor switch. Semiconductor switches may be for example transistors and thyristors. The semiconductor chip may for example be a transistor, a thyristor, a diode, an IGBT, an RC-IGBT, a BiGT, a MOSFET etc. and in particular a SiC based version of them.

According to at least one exemplary embodiment of the invention, the material of the first electrically conductive layer may have a melting point of above 1500° C., exemplarily above 2000° C., or exemplarily above 2500° C., and the material of the second electrically conductive layer may have a melting point below 1500° C., exemplarily below 1200°, or exemplarily below 900° C. The melting point of the material of the second electrically conductive layer is higher than the temperature of the semiconductor chip during normal operation, at least above 200 C, exemplarily above 400° C. Exemplarily, the melting point of the material of the first electrically conductive layer is higher than the melting point of the semiconductor chip. The first electrically conductive layer may for example comprise one of molybdenum (Mo), tungsten (W) or an alloy thereof. Mo may be beneficial because it has a similar coefficient of thermal expansion as wide-bandgap semiconductor materials, e.g., SiC. The second electrically conductive layer may for example comprises one of aluminium (Al), copper (Cu), silver (Ag), gold (Au), tin (Sn), lead (Pb), magnesium (Mg) or an alloy thereof. The first electrically conductive layer and the second electrically conductive layer may for example be bonded to each other. The at least one protrusion exemplarily is made from the same material as the first electrically conducting layer and may be integrally formed with it, however this does not exclude that the first electrically conducting layer and the at least one protrusion are made from different materials, as long as the material of the at least one protrusion has a higher melting point than the material of the second electrically conductive layer, exemplarily substantially the same as the first electrically conducting layer.

According to at least one exemplary embodiment the semiconductor chip comprises a semiconductor layer and a metallization layer on the semiconductor layer at the top surface of the semiconductor chip. The metallization layer is in direct contact with the preform and with the semiconductor layer. A contact area between the metallization layer and the semiconductor layer defines an active area of the semiconductor chip. Throughout the specification a contact area between two layers or elements includes all positions where the two layers or elements are in direct contact with each other. The size of the contact area between the bottom surface of the preform and the top surface of the semiconductor chip is larger than 50%, for example larger than 80%, or for example larger than 90% of a size of the active area of the semiconductor chip. By this, the power module achieves optimal performance in normal operation. The contact area is less than 100%, for example less than 98%, or for example less than 95% of the active area of the semiconductor chip in order to prevent contact between the preform and an edge termination providing voltage blocking capability of the semiconductor chip. According to an aspect of the invention, due to the improved SCFM, larger semiconductor chips may be used. In an exemplary embodiment the size of the active area of the semiconductor chip may therefore be larger than 100 mm$^2$ (e.g., 10 mm×10 mm), and in particular larger than 150 mm$^2$ (e.g., 12.4 mm×12.4 mm).

A size of the bottom surface of the at least one protrusion is less than 60%, for example less than 30%, or for example less than 10% of the size of the active area of the semiconductor chip. The smaller the bottom surface of the at least one protrusion, the easier it penetrates through residual semiconductor material. Exemplarily, a size of the bottom surface of the at least one protrusion may be larger than 1% of the size of the active area of the semiconductor chip to provide sufficient mechanical stability in the short circuit failure mode.

According to an exemplary embodiment of the invention, the bottom surface of the preform may be formed by a bottom surface of the second electrically conductive layer. This means that during normal operation the second electrically conductive surface is in contact with the top surface of the semiconductor chip whereas the first electrically conductive layer and/or the at least one protrusion do not directly contact the top surface of the semiconductor chip. In other words, the at least one protrusion may be completely embedded/immersed in the second electrically conductive layer. This provides the advantage that it is easier to produce a flat smooth bottom surface for the preform. By this the electrical contact between the preform and the semiconductor chip may be further improved and potential problems due to mechanical properties differences between the first electrically conducting layer and the second electrically conducting layer may be reduced. For instance, a material of the first electrically conductive layer and a material of the second electrically conductive layer may have different thermal expansion coefficients, which may lead to an increase of mechanical stress at the interface between the bottom surface of the preform and the top surface of the semiconductor chip when both the first electrically conducting layer and the second electrically conducting layer would form the bottom surface of preform.

According to another embodiment of the invention, the bottom surface of the preform may be formed by both a bottom surface of the second electrically conductive layer and a bottom surface of the at least one protrusion. Thus, in normal mode, both the electrically conductive first layer and the electrically conductive second layer are in contact with top surface of the semiconductor chip. Since there is no material between the protrusion the base plate except the semiconductor chip, this configuration may provide the advantage that in the case of a failure event the short circuit is established faster because there is less material to be removed/melted.

According to an exemplary embodiment of the invention the at least one protrusion may have a vertical, a rounded or an inclined edge. A vertical edge is an edge which is substantially perpendicular to the top and/or the bottom surface of the semiconductor chip. An inclined edge is an edge which is tilted with respect to a surface normal of the top and/or the bottom surface of the semiconductor chip. A rounded edge is an edge which has a curved surface. For example, the at least one protrusion may have a cylindrical shape, a spherical cap shape, or a conical shape. A spherical cap shape is a shape of a sphere cut off by a plane parallel to the top surface and/or bottom surface of the semiconductor chip. A cylindrical shape is a shape which has a constant cross-section. A conical shape is a shape which tapers from a larger cross-section to a smaller cross-section. A cross-section is determined in a plane parallel to the top surface and/or bottom surface of the semiconductor chip. A cross-section may have various shapes. For example, a cross-section may be a circular cross-section, an oval cross-section or a polygonal cross-section. A rounded and/or an inclined edge may facilitate penetration through residual semiconductor material, in particular by pushing debris away in a lateral direction. Similarly, a conical shape and/or a spherical cap shape may facilitate penetration through residual semiconductor material.

According to an embodiment of the invention, the preform may have a coefficient of thermal expansion which differs from the coefficient of thermal expansion of the semiconductor chip in a range of less than 250%, in particular less than 50%. Therein, the reference for the values in percentage is the coefficient of thermal expansion of the semiconductor chip. This may lead to the advantage that the risk of the internal stress inside the power semiconductor module does not exceed an upper limit and thus the risk of cracks to be formed is reduced. This effect is of particular relevance if the semiconductor device is a high power semiconductor device.

According to an aspect of the invention, the power semiconductor module according to the embodiment of the invention may be stacked with a further equally designed power semiconductor module. In such a way, the power semiconductor module according to the embodiment of the invention may be electrically connected in series. When one of the semiconductor modules has a fault, the respective preform bridges the semiconductor chip. Thus, the series connection of the semiconductor module may stay in operation with one semiconductor less.

In such a way, wide bandgap material based power semiconductor modules may be reliably used in high voltage applications, in which a plurality of power semiconductors are connected in series such as HVDC applications, STATCOM applications, etc.

FIG. 1A shows a cross-section through a power semiconductor module comprising an electrically conductive base plate 1', a SiC chip 2', a large area Mo-preform 3' and an pressing element 4' stacked in this order in a sandwich structure. FIG. 1B illustrates a limitation of this power semiconductor module. In the short circuit failure mode an electrical connection should be established between the base plate 1' and the pressing element 4'. However, when the SiC chip is not completely removed by failure arc plasma, residual SiC particles, i.e. debris 8', may prevent direct contract between the preform 3' and the base plate 1'. Thus, there is no conductive path (a short circuit) established between the base plate 1' and the preform 3'. Debris preventing the contact between the preform 3' and the base plate 1' is particular problematic for large preforms 3' and large chips.

Figure 2A:
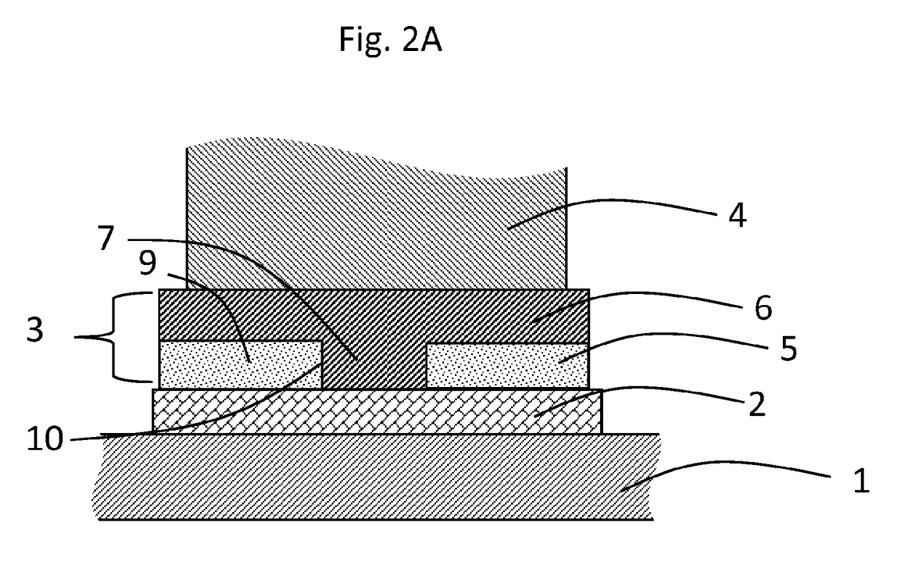
FIG. 2A schematically illustrates a power semiconductor module with short circuit failure mode capability according to an embodiment of the invention.

FIG. 2A shows a cross-section through an exemplary embodiment of the power semiconductor module according to the invention. The power semiconductor module comprises an electrically conductive base plate 1, a semiconductor chip 2, a preform 3 and an electrically conducting pressing element 4. The exemplary embodiment shown may be a power semiconductor module suitable for high power applications, in which high electric voltages (>1000 V) and high electric currents (>10 A) are used. The semiconductor chip 2 therefore comprises a semiconductor layer of a wide-bandgap semiconductor material, for example SiC (silicon carbide) or GaN (gallium nitride) The semiconductor chip may be a semiconductor device, for example an insulated gate bipolar transistor (IGBT), a diode, a thyristor, a transistor, a semiconductor field-effect transistor (MOSFET) or the like. The semiconductor chip 2 may comprise an emitter electrode (anode, source) at its upper side (top surface) and a collector electrode (cathode, drain) at its lower side (bottom surface). Therein, the electrodes are not shown in the figures. Alternatively, the semiconductor chip 2 may comprise an emitter electrode (anode, source) at its lower side and a collector electrode (cathode, drain) at its upper side (the electrodes are not shown). The electrodes are in electrical contact with the semiconductor layer. More generally, the emitter electrode forms a load connection of the semiconductor chip 2 and the collector electrode forms a further load connection of the semiconductor chip 2. The semiconductor chip 2 may also comprise a gate electrode (not shown) or the like for controlling the semiconductor chip 2. An electrode may be provided in form of a metallization layer. A contact area between the metallization layer at the upper side (top surface) of the semiconductor chip 2 and the semiconductor layer defines an active area of the semiconductor chip 2. The semiconductor chip 2 is arranged between the electrically conductive base plate 1 and the preform 3. The electrically conductive base plate 1 serves as a base or as a support of the power semiconductor module. A bottom surface of the semiconductor chip 2 (e.g., the collector electrode) is in laminar contact with a top surface of the electrically conductive base plate 1. The electrically conductive base plate 1 is bonded to the semiconductor chip 2. Alternatively, but less favorably, the semiconductor chip 2 may only be pressed onto the electrically conductive base plate 1. The electrically conductive base plate 1 exemplarily has a coefficient of thermal expansion which differs from the coefficient of thermal expansion of the semiconductor chip in a range of less than 250%, in particular of less than 50%. This may be realized by forming the base plate 1 of molybdenum, a copper-molybdenum alloy, or an aluminum-graphite composite, for example. However, this does not exclude other materials such, e.g., copper. A bottom surface of the electrically conductive base plate 1 may form a contact surface for contacting the power semiconductor module.

A top surface of the semiconductor chip 2 (e.g., the emitter electrode) is in contact with a bottom surface of the preform 3. The preform 3 is only be pressed against the semiconductor chip 2. However, the bottom surface of the preform 3 may also be bonded to the semiconductor chip 2. The preform 3 may have a thermal expansion coefficient which differs from the thermal expansion coefficient of the semiconductor chip 2 in a range of less than 250%, in particular of less than 50%. A top surface of the preform 3 is in contact with a pressing element 4. The pressing element 4 presses against the preform 3 and thus presses the preform 3 against the semiconductor chip 2. However it may also be bonded to the preform 3. The pressing element 4 may for example be a spring. A top surface of the electrically conducting pressing element 4 may form a contact surface for contacting the power semiconductor module.

The preform 3 comprises a first electrically conductive layer 6 and a second electrically conductive layer 5. The preform 3 may therefore be a hybrid preform. The first electrically conductive layer 6 has a protrusion 7 protruding towards the top surface of the semiconductor layer 2. The protrusion 7 has a cylindrical shape. The protrusion 7 forms a recess 9 in the first electrically conductive layer 6 of the preform 3. The recess 9 annularly surrounds the protrusion 7. The protrusion 7 and the first electrically conductive layer 6 are integrally formed; however, embodiments are not limited to that.

The electrically conductive layer 5 is disposed in the recess 9 and on the top surface of the semiconductor chip 2. A top surface of the second electrically conductive layer 5 is in contact with a bottom surface of the first electrically conductive layer 6; and a bottom surface of the second electrically conductive layer 5 is in contact with a top surface of the semiconductor chip 2. The first electrically conductive layer 6 and the second electrically conductive layer 5 may be bonded to each other. The protrusion 7 protrudes into the second electrically conductive layer 5. The protrusion 7 is embedded in the second electrically conductive layer 5. A bottom surface of the protrusion 7 and a bottom surface of the second electrically conductive layer 5 form the bottom surface of the preform 3. In an exemplary embodiment, the preform 3 covers about 95% of the active area of the semiconductor chip 2. The length of the protrusion 7, i.e. the dimension of the protrusion 7 in the protruding direction, is adapted to the thickness of the semiconductor chip. In other words, the protrusion 7 is sufficiently long such that it can protrude through residual semiconductor material 8, in case such is left. The thickness of the semiconductor chip 2 depends on the electric specification, i.e. on the blocking desired blocking voltage. The thickness of the semiconductor chip may be in the range between 50 µm and 500 µm, exemplarily in the range between 50 µm and 200 µm. Accordingly, the length of the protrusion should also be in this range. The length of the protrusion 7 is the same as the thickness of the second electrically conductive layer 5. Thus the bottom surface of the preform 3 is flat, i.e. without any steps or the like. The thickness of the preform 3 may be in the range between 600 µm and 3000 µm. The area of the semiconductor chip may for example be in a range of 15 mm$^2$ and 70 mm$^2$, exemplarily in a range of 25 mm$^2$ and 60 mm$^2$. The thickness of the first electrically conductive layer 6 may be in the range between 0.3 mm and 2 mm, exemplarily in the range of 0.5 mm and 1.5 mm. The thickness of the second electrically conductive layer may be in the range of 0.3 mm and 2 mm, exemplarily in the range of 0.5 mm and 1.5 mm.

A material of the first electrically conductive layer 6 is selected to withstand the high temperatures of a failure arc plasma occurring in a failure event. The second electrically conductive layer serves as a sacrificial layer. The material of the second electrically conductive layer 5 therefore is configured to disintegrate/evaporate/melt at such a temperature. Withstanding in this context means that the material of the first electrically conductive layer is hardly altered compared to a material of the second electrically conductive layer 5 and/or disintegrates/evaporates/melts only after a significantly longer time span of being exposed to the failure arc plasma, for example a time span which is 100 times longer than for the material of the second electrically conducting layer 5. A material of the first electrically conductive layer 6 is for example Mo (molybdenum) and a material of the second electrically conductive layer 5 is for example Al (Aluminum). However embodiments are not limited to these choices. W (tungsten) may for example also be a material of the first electrically conducting layer 6. A material of the second electrically conductive layer 5 may for example also be one of copper (Cu), silver (Ag), gold (Au), magnesium (Mg) etc. or an alloy thereof.

Mo has a melting point which is higher than 2500° C. Al has a melting point which is below 900° C. and above the temperature of the semiconductor module in normal operation, which ranges up to 150° C. or 225° C. or more. In addition, the first electrically conductive layer 6 differs from the coefficient of thermal expansion of the semiconductor material in a range of less than 250%, in particular less than 50%.

Figure 2B:
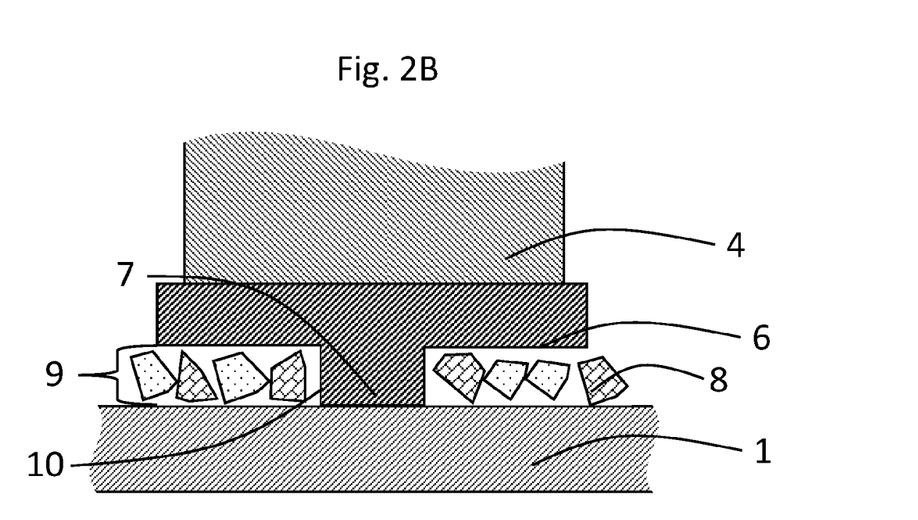
FIG. 2B schematically illustrates a power semiconductor module according to the invention in a short circuit failure mode.

FIG. 2B illustrates the power module in the short circuit failure mode, i.e. when a failure event has occurred. During the failure event, energy is dissipated which causes the material of the second electrically conductive layer 5 to disintegrate/melt/evaporate, thus leaving only the protrusion 7, which due to its beneficial shape (e.g., smaller cross-section) penetrates more easily through remaining material of the semiconductor chip (e.g., debris 8). The pressing force to move the preform towards the base plate 1 comes from the pressing element 4. The debris 8 may comprise residual material of the semiconductor chip 2 and/or residual material of the second electrically conductive layer 5. In contrast to the embodiment shown in FIGS. 1A and 1B, where direct contact is prevented by debris 8 located on the base plate 1, contact between the bottom plate 1 and the preform 3 is now established.

FIGS. 3A-E schematically illustrate different embodiments of the preform 3. Due to the many similarities between the preforms, only differences between the embodiments will be described. With regard to all other features it is referred to the above discussion of the first embodiment described above.

Figure 3A:
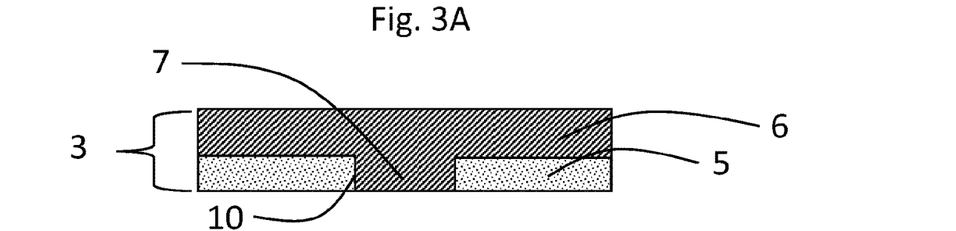
FIGS. 3A-E schematically illustrate different embodiments of a preform according to the invention.

FIG. 3A shows the preform 3 of the first embodiment described with respect to FIG. 2A. Therein, a bottom surface of the first electrically conducting layer 6 and a bottom surface of the second electrically conducting layer 5 together form the bottom surface of the preform 3. The bottom surface of the preform 3 is flat. Both a bottom surface of the protrusion 7 and a bottom surface of the second electrically conducting layer 5 contact the top surface of the semiconductor chip 2 (only shown in FIG. 2A). Since there is no material between the protrusion 7 and the base plate 1 except the semiconductor chip 2, this configuration may provide the advantage that in the case of a failure event the short circuit is established faster because there is less material to be removed/melted. The protrusion 7 has a cylindrical shape and is surrounded by the second electrically conductive layer 5. The cylindrical shape may be a circular cylindrical shape, i.e. with a circular cross-section. The cross-section is determined in a plane parallel to the top surface of the semiconductor chip 2. However other cross-sections of the cylindrical shape may also be possible, e.g., an oval cross-section or a polygonal cross-section etc. The protrusion 7 has a vertical edge 10, thus the cross-section of the protrusion 7 remains constant along the length of the protrusion.

Figure 3B:
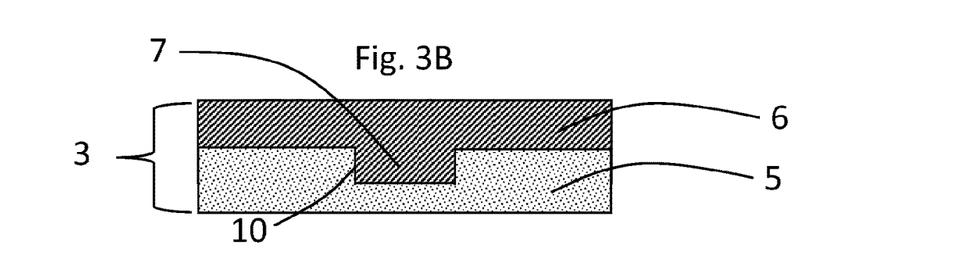

FIG. 3B shows an exemplary embodiment where the protrusion 7 is embedded in the second electrically conducting layer 5. The bottom surface of the preform 3 is formed only by the second electrically conducting layer 5. In contrast to the embodiment shown in FIG. 3A, the bottom surface of the protrusion 7 is not part of the bottom surface of the preform 3. Since the bottom surface of the preform 3 comprises only material of the second electrically conducting layer 5, it may be easier to fabricate a flat bottom surface than with the arrangement shown in FIG. 3A.

Figure 3C:
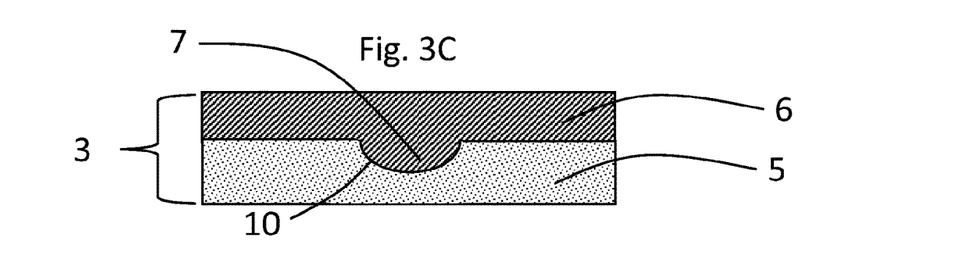

FIG. 3C shows an exemplary embodiment where the protrusion 7 has a rounded edge 10. The protrusion 7 may for example have the shape of a spherical cap, e.g., a hemisphere. The cross-section of the protrusion 7 decreases along its length direction. This may help to push debris 8 in a lateral direction and thus facilitate penetration of the protrusion 7 through residual material of the semiconductor chip.

Figure 3D:
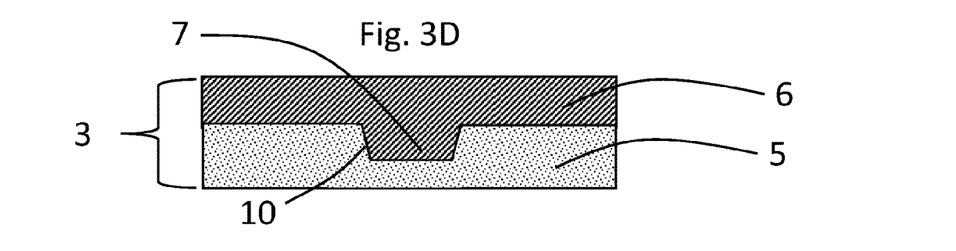

FIG. 3D shows an exemplary embodiment where the protrusion 7 has a conical shape. The protrusion 7 has an inclined edge 10. The cross-section of the protrusion deceases along its length direction. This may help to push debris 8 in a lateral direction and thus facilitate penetration of the protrusion 7 through residual material of the semiconductor chip.

Figure 3E:
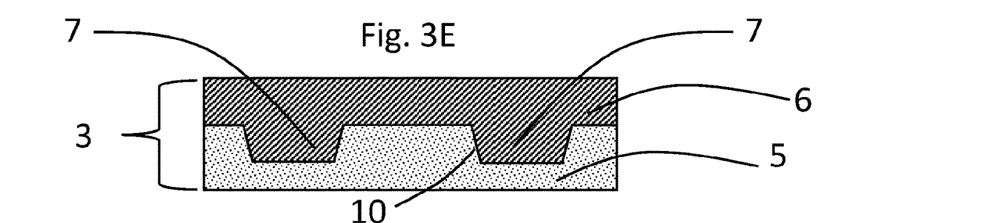

FIG. 3E shows an exemplary embodiment where the first electrically conductive layer 6 comprises a plurality of protrusions 7 designed such that they increase the total short circuit contact area, while still being able to penetrate through the debris 8. This approach also provides improved mechanical stability compared to a single protrusion 7. In this illustration, the protrusions 7 are conically shaped. However, embodiments with a multitude of protrusions 7 are not limited to conical shapes and the protrusions 7 may have various other shapes, for example the shapes described above or variations of them.

While embodiments of the invention have been illustrated and described in detail in the drawings and foregoing description, such illustration and description are to be considered illustrative or exemplary and not restrictive; the invention is not limited to the disclosed embodiments. It will be apparent for persons skilled in the art that modifications of the above described embodiments are possible without departing from the scope of the invention as defined by the appended claims. Other variations to the disclosed embodiments can be understood and effected by those skilled in the art and practising the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference sign in the claims should not be construed as limiting the scope.

The invention claimed is:

1. A power semiconductor module, comprising:
a base plate having a top surface and a bottom surface;
a semiconductor chip having a bottom surface and a top surface, the semiconductor chip being disposed on the top surface of the base plate, the bottom surface of the semiconductor chip being in contact with the top surface of the base plate, the semiconductor chip including a wide-bandgap semiconductor material;
a preform having a bottom surface and a top surface, the preform being disposed on the top surface of the semiconductor chip, the bottom surface of the preform being in contact with the top surface of the semiconductor chip, the preform comprising a first electrically conductive layer and a second electrically conductive layer, wherein the first electrically conductive layer has a protrusion protruding towards the top surface of the semiconductor chip and defining at least one recess in the first electrically conductive layer of the preform, the protrusion and the first electrically conductive layer being made from the same material or from different materials, and wherein at least a portion of the second electrically conductive layer is positioned in the recess and on the top surface of the semiconductor chip, the material of the protrusion having a higher melting point than the material of the second electrically conductive layer; and
a pressing element in contact with the top surface of the preform and configured to apply a pressure onto the top surface of the preform, wherein the power semiconductor module is configured so that in an event of semiconductor chip failure with heat dissipation causing the semiconductor chip to be defective, the protrusion of the first electrically conductive layer penetrates through residual material of the semiconductor chip upon pressure applied by the pressing element towards the base plate so as to establish a contact between the protrusion of the first electrically conductive layer and the base plate and form a short circuit bridging the defective semiconductor chip in a short circuit failure mode.

2. The power semiconductor module according to claim 1, wherein the pressing element is in laminar contact with the top surface of the preform, the bottom surface of the preform is in laminar contact with the top surface of the semiconductor chip, and the bottom surface of the semiconductor chip is in laminar contact with the top surface of the base plate and attached to the base plate.

3. The power semiconductor module according to claim 1, wherein the protrusion is laterally surrounded by the second electrically conductive layer.

4. The power semiconductor module according to claim 1, wherein the bottom surface of the preform is formed by a bottom surface of the second electrically conductive layer.

5. The power semiconductor module according to claim 1, wherein the bottom surface of the preform is formed by a bottom surface of the second electrically conductive layer and a bottom surface of the protrusion.

6. The power semiconductor module according to claim 1, wherein the material of the first electrically conductive layer has a melting point of above 1500° C. and the material of the second electrically conductive layer has a melting point below 1500° C.

7. The power semiconductor module according to claim 1, wherein the material of the first electrically conductive layer has a melting point of above 2000° C. and the material of the second electrically conductive layer has a melting point below 1200° C.

8. The power semiconductor module according to claim 1, wherein the protrusion has a vertical, a rounded or an inclined edge.

9. The power semiconductor module according to claim 1, wherein the protrusion has a cylindrical shape, a spherical cap shape, or a conical shape.

10. The power semiconductor module according to claim 1, wherein the first electrically conductive layer comprises molybdenum, tungsten or an alloy thereof.

11. The power semiconductor module according to claim 1, wherein the material of the second electrically conductive layer comprises a material selected from the group consisting of aluminum, copper, silver, gold, tin, lead, magnesium and alloys thereof.

12. The power semiconductor module according to claim 1, wherein the wide-bandgap semiconductor material included in the semiconductor chip comprises silicon carbide or gallium nitride.

13. The power semiconductor module according to claim 1, wherein the preform has a coefficient of thermal expansion that differs from the coefficient of thermal expansion of the semiconductor chip in a range of less than 250%.

14. The power semiconductor module according to claim 1, wherein the preform has a coefficient of thermal expansion that differs from the coefficient of thermal expansion of the semiconductor chip in a range of less than 50%.

15. A power semiconductor module, comprising:
a base plate having a top surface and a bottom surface;
a semiconductor chip having a bottom surface and a top surface, the semiconductor chip being disposed on the top surface of the base plate, the bottom surface of the semiconductor chip being in contact with the top surface of the base plate, the semiconductor chip including a wide-bandgap semiconductor material, wherein the semiconductor chip comprises a semiconductor layer and a metallization layer on the semiconductor layer at the top surface of the semiconductor chip and wherein a contact area between the metallization layer and the semiconductor layer defines an active area of the semiconductor chip;
a preform having a bottom surface and a top surface, the preform being in direct contact with the top surface of the semiconductor chip, the bottom surface of the preform being in contact with the top surface of the semiconductor chip, the preform comprising a first electrically conductive layer and a second electrically conductive layer, wherein the first electrically conductive layer has a protrusion protruding towards the top surface of the semiconductor chip and defining at least one recess in the first electrically conductive layer of the preform, the protrusion and the first electrically conductive layer being made from the same material or from different materials, and wherein at least a portion of the second electrically conductive layer is positioned in the recess and on the top surface of the semiconductor chip, the material of the protrusion having a higher melting point than the material of the second electrically conductive layer; and
a pressing element in contact with the top surface of the preform and configured to apply a pressure onto the top surface of the preform, wherein the power semiconductor module is configured so that in an event of semiconductor chip failure with heat dissipation causing the semiconductor chip to be defective, the protrusion of the first electrically conductive layer penetrates through residual material of the semiconductor chip upon pressure applied by the pressing element towards the base plate so as to establish a contact between the protrusion of the first electrically conductive layer and the base plate and form a short circuit bridging the defective semiconductor chip in a short circuit failure mode.

16. The power semiconductor module according to claim 15, wherein a size of a contact area between the bottom surface of the preform and the top surface of the semiconductor chip is at least 50% and less than 100% of the size of the active area of the semiconductor chip.

17. The power semiconductor module according to claim 15, wherein a size of a contact area between the bottom surface of the preform and the top surface of the semiconductor chip is between 80% and 98% of the size of the active area of the semiconductor chip.

18. The power semiconductor module according to claim 15, wherein a size of a contact area between the bottom surface of the preform and the top surface of the semiconductor chip is between 90% and 95% of the size of the active area of the semiconductor chip.

19. The power semiconductor module according to claim 15, wherein a size of the bottom surface of the protrusion is less than 60% of a size of the active area of the semiconductor chip.

20. The power semiconductor module according to claim 15, wherein a size of the bottom surface of the protrusion is less than 10% of a size of the active area of the semiconductor chip.

21. A power semiconductor module, comprising:
a base plate having a top surface and a bottom surface;
a semiconductor chip having a bottom surface and a top surface, the semiconductor chip being disposed on the top surface of the base plate, the bottom surface of the semiconductor chip being in contact with the top surface of the base plate, the semiconductor chip including a wide-bandgap semiconductor material;
a preform having a bottom surface and a top surface, the bottom surface of the preform being in contact with the top surface of the semiconductor chip and having a coefficient of thermal expansion that differs from the coefficient of thermal expansion of the semiconductor chip by less than 50%, the preform comprising a first electrically conductive layer having a melting point above 2000° C. and a second electrically conductive layer having a melting point below 1200° C., wherein the first electrically conductive layer has a protrusion protruding towards the top surface of the semiconductor chip and defining at least one recess in the first electrically conductive layer of the preform, the protrusion and the first electrically conductive layer being made from the same material or from different materials, and wherein at least a portion of the second electrically conductive layer is positioned in the recess and on the top surface of the semiconductor chip, the material of the protrusion having a higher melting point than the material of the second electrically conductive layer; and
a pressing element in contact with the top surface of the preform and configured to apply a pressure onto the top surface of the preform, wherein the power semiconductor module is configured so that in an event of semiconductor chip failure with heat dissipation causing the semiconductor chip to be defective, the protrusion of the first electrically conductive layer penetrates through residual material of the semiconductor chip upon pressure applied by the pressing element towards the base plate so as to establish a contact between the protrusion of the first electrically conductive layer and the base plate and form a short circuit bridging the defective semiconductor chip in a short circuit failure mode.

* * * * *